(12) United States Patent
Chen et al.

(10) Patent No.: US 6,943,118 B2
(45) Date of Patent: Sep. 13, 2005

(54) METHOD OF FABRICATING FLASH MEMORY

(75) Inventors: Kuang-Chao Chen, Hsinchu (TW); Jui-Lin Lu, Hsinchu (TW); Ling-Wuu Yang, Taichung (TW)

(73) Assignee: Macronix International Co., Ltd., Hisinchu (TW)

( * ) Notice: Subject to any disclaimer, the term of this patent is extended or adjusted under 35 U.S.C. 154(b) by 49 days.

(21) Appl. No.: 10/605,255

(22) Filed: Sep. 18, 2003

(65) Prior Publication Data

US 2005/0064713 A1 Mar. 24, 2005

(51) Int. Cl.[7] .............................................. H01L 21/302
(52) U.S. Cl. ........................ 438/694; 438/696; 438/699; 438/705; 438/719; 438/723; 438/724
(58) Field of Search ................................ 438/694, 696, 438/699, 705, 719, 723, 724, 697

(56) References Cited

U.S. PATENT DOCUMENTS

| | | | | |
|---|---|---|---|---|
| 6,406,961 B1 | * | 6/2002 | Chen | 438/266 |
| 6,462,372 B1 | * | 10/2002 | Wu | 257/314 |
| 6,689,658 B2 | * | 2/2004 | Wu | 438/257 |
| 6,713,834 B2 | * | 3/2004 | Mori et al. | 257/510 |
| 6,791,142 B2 | * | 9/2004 | Tseng | 257/316 |
| 6,797,565 B1 | * | 9/2004 | Yang et al. | 438/261 |
| 6,818,508 B2 | * | 11/2004 | Shimizu et al. | 438/257 |

* cited by examiner

Primary Examiner—Nadine G. Norton
Assistant Examiner—Binh X. Tran
(74) Attorney, Agent, or Firm—Jianq Chyun IP office

(57) ABSTRACT

In a method of fabricating a flash memory, a tunneling dielectric layer, a first conductive layer and a mask layer are sequentially formed on a substrate to form a gate structure. Buried source/drain regions are then formed in the substrate between the strips. The strips are further patterned into floating gate structures. An insulation layer is formed sideways adjacent to the gate structure. The insulation layer has a top surface lower than a top surface of the first conductive layer of the gate structure. The mask layer is removed, and an additional conductive layer is formed on the first conductive layer in a manner to extend over the adjacent insulation layer. The first and additional conductive layers form a floating gate. A gate dielectric layer is formed on the floating gate, and a control gate is formed on the gate dielectric layer.

20 Claims, 9 Drawing Sheets

METHOD OF FABRICATING FLASH MEMORY

BACKGROUND OF INVENTION

1. Field of the Invention

The invention relates in general to a method of fabricating a flash memory, and more particularly, to a method of a flash memory in which an overlapping area between a floating gate and a control gate is increased.

2. Related Art of the Invention

Flash memory has been broadly applied in personal computer and electronic products due to the superior data retention characteristics.

The typical flash memory has a stack-gate structure, which comprises a tunneling oxide layer, a polysilicon floating gate used to store charges, a silicon oxide/silicon nitride/silicon oxide (ONO) dielectric layer, and a polysilicon control gate used to control the data access.

Normally, the larger the gate-coupling ratio (GCR) between the floating gate and the control gate, the lower the operation voltage required. Consequently, operation speed and efficiency are greatly enhanced. The method of increasing the gate-coupling ratio includes increasing the overlap area, the thickness of the dielectric layer, and the dielectric constant k of the dielectric layer between the floating gate and the control gate.

As mentioned above, increasing the overlap area between the floating gate and the control gate is advantageous to increasing the gate-coupling ratio. However, due to the continuous demand of higher integration, the area occupied by each memory cell has to be reduced. Therefore, how to fabricate a flash memory with a high gate-coupling rate within limited chip area has become an important task.

SUMMARY OF INVENTION

The present invention provides a method of fabricating a flash memory in which the overlap area between a floating gate and a control gate is increased, such that the coupling ratio thereof is increased.

The method of fabricating a flash memory provided by the present invention comprises the following steps. A tunneling dielectric layer, a conductive layer and a mask layer are sequentially formed on a substrate. The mask layer, the conductive layer and the tunneling dielectric layer are patterned to form longitudinally arranged strips on the substrate. Buried source/drain regions are then formed in the substrate between the strips. The strips are further patterned to form gate structures, which thus respectively comprise one patterned tunneling dielectric layer, one patterned conductive layer and one patterned mask layer. An insulation layer is formed on sideways adjacent to the gate structures. The insulation layer has a top surface at a height lower than a top surface of the patterned conductive layer of the gate structures, such that a part of the sidewalls of the gate structures is exposed. A material layer then is formed on the insulation layer sideways adjacent to the gate structures. The patterned mask layer is removed to expose the top surface of the patterned conductive layer. An additional patterned conductive layer then is formed on the exposed patterned conductive layer in a manner to extend over the sideways adjacent material layer. The additional patterned conductive layer thereby has an area greater than that of the first patterned conductive layer, and forms with this latter a floating gate. The material layer then is removed, and a gate dielectric layer is formed on the exposed top surface and sidewalls of the floating gates. Lastly, a control gate is formed on the gate dielectric layer.

In the present invention, the height of the insulation layer formed sideways adjacent to the gate structures is reduced, such that the additional patterned conductive layer formed on the first patterned conductive layer extends over the buried source/drain regions to form a floating gate. As a result, the overlapping area between the control gate and the floating gate is increased, and the gate-coupling ratio is increased.

BRIEF DESCRIPTION OF DRAWINGS

These, as well as other features of the present invention, will become more apparent upon reference to the following drawings.

DETAILED DESCRIPTION

Figure 1A:
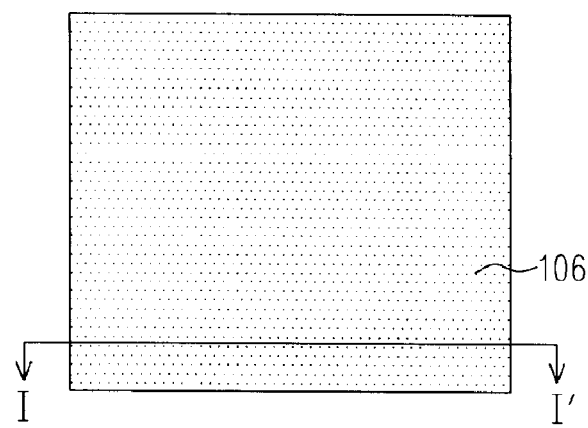
FIGS. 1A to 1L are top views showing the fabrication process of a flash memory according to an embodiment of the present invention.

FIGS. 1A to 1L are top views showing the fabrication process of a flash memory according to a preferred embodiment of the present invention. FIGS. 2A to 2L are cross-sectional views along line I–I" as shown in FIGS. 1A to 1L, respectively. Referring to FIGS. 1A and 2A, a substrate 100 is provided. The substrate 100 is, for example, a silicon substrate. A tunneling dielectric layer 102, a conductive layer 104 and a mask layer 106 are sequentially formed on the substrate 100. The material of the tunneling dielectric layer 102 includes silicon oxide, and the thickness thereof is about 50 angstroms to about 100 angstroms, for example.

The method for forming the tunneling dielectric layer 102 includes thermal oxidation or low-pressure chemical vapor deposition (LPCVD), for example. The material of the conductive layer 104 includes doped polysilicon, which is formed by, for example, performing low-pressure chemical vapor deposition with silane as a gas source to deposit a polysilicon layer, followed by an dopant implantation process. The operation of the deposition process is about 575° C. to about 650° C., and the operation pressure thereof is about 0.3 torr to about 0.6 torr.

The material of the mask layer 106 includes silicon nitride or silicon oxide. Silicon nitride is formed by, for example, performing a low-pressure chemical vapor deposition using dichloro-silane and ammonia as reacting gases.

Figure 1B:
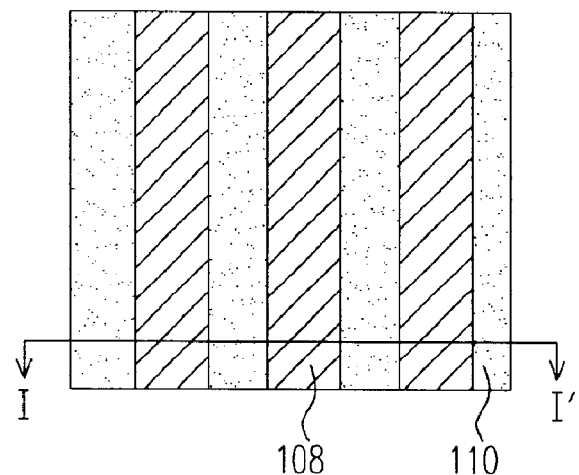
Figure 2A:
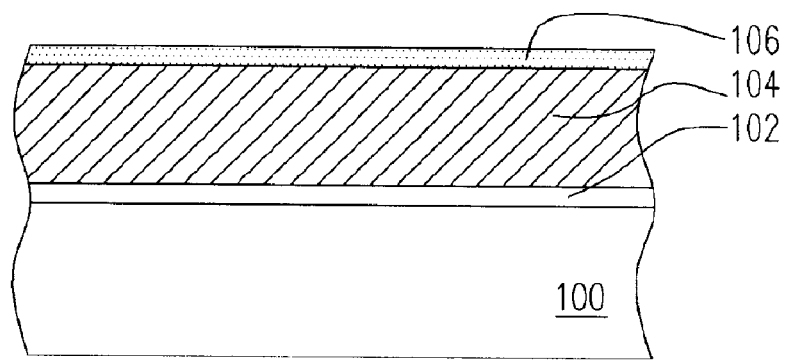
FIGS. 2A to 2L are cross-sectional views respectively taken along section I–I" of FIGS. 1A to 1L.
Figure 2B:
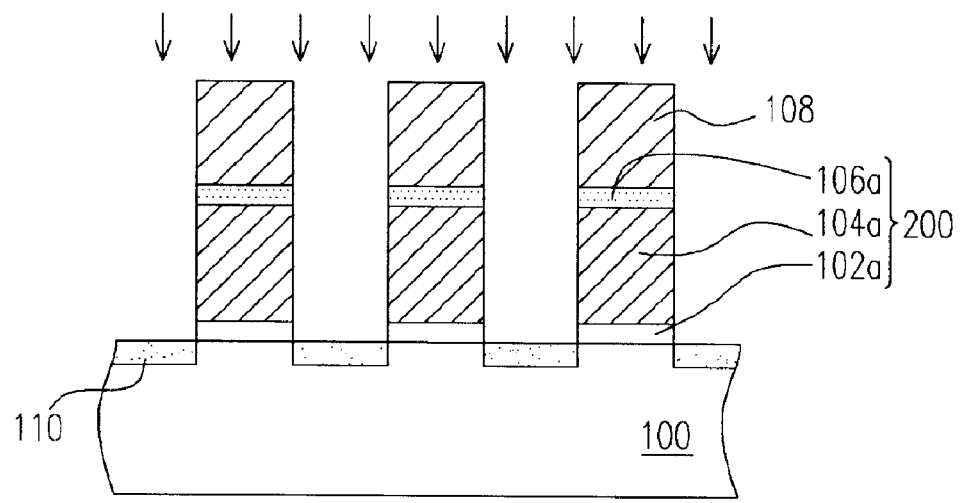

Referring to FIGS. 1B and 2B, a patterned photoresist layer 108 is formed on the mask layer 106. The mask layer 106, the conductive layer 104 and the tunneling dielectric layer 102 are etched using the patterned photoresist layer 108 as a mask to form a plurality of strips 200 longitudinally arranged on the substrate 100. The strips 200 respectively comprise the patterned tunneling dielectric layer 102a, the patterned conductive layer 104a, and the patterned mask layer 106a. An ion implantation step is performed to form buried source/drain regions 110 in the substrate between the strips 200.

Figure 1C:
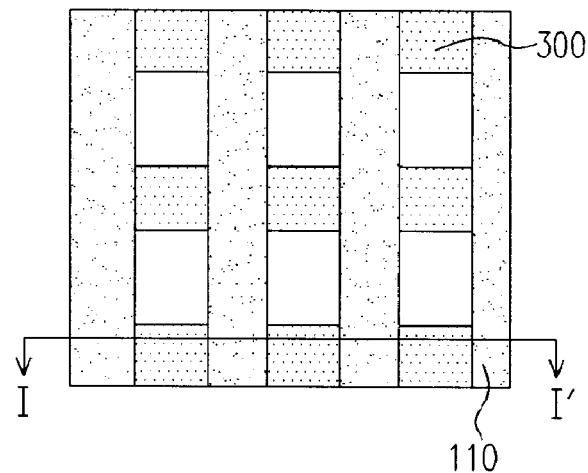
Figure 2C:
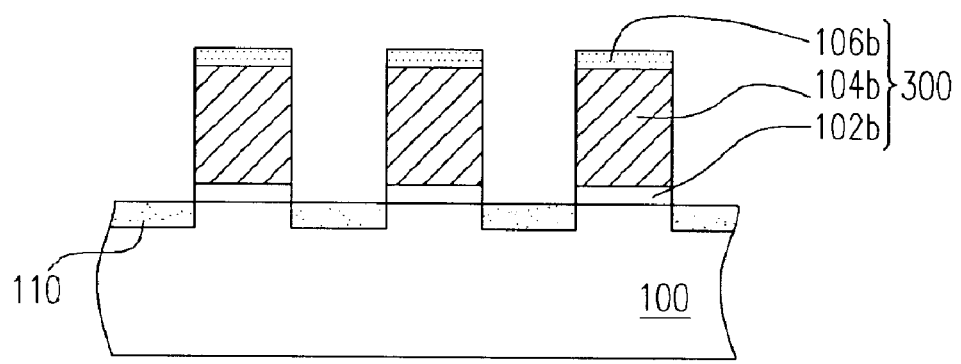

Referring to FIGS. 1C and 2C, the patterned photoresist layer 108 is removed. Another patterned photoresist layer (not shown) is formed on the strips, and the strips 200 are etched using the patterned photoresist layer as a mask to form the gate structures 300. The floating gate structures 300 comprise the patterned tunneling dielectric layer 102b, the patterned conductive layer 104b, and the patterned mask layer 106b.

Figure 1D:
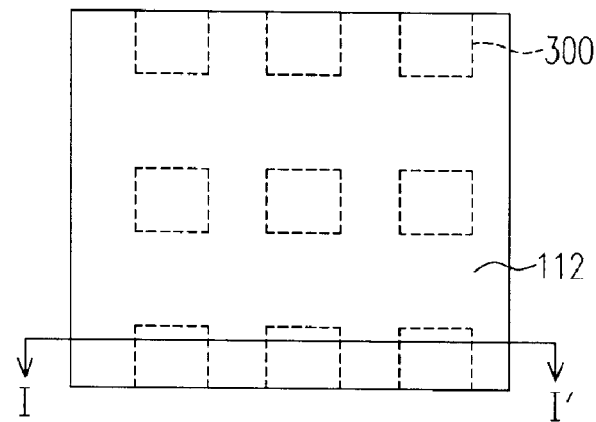
Figure 2D:
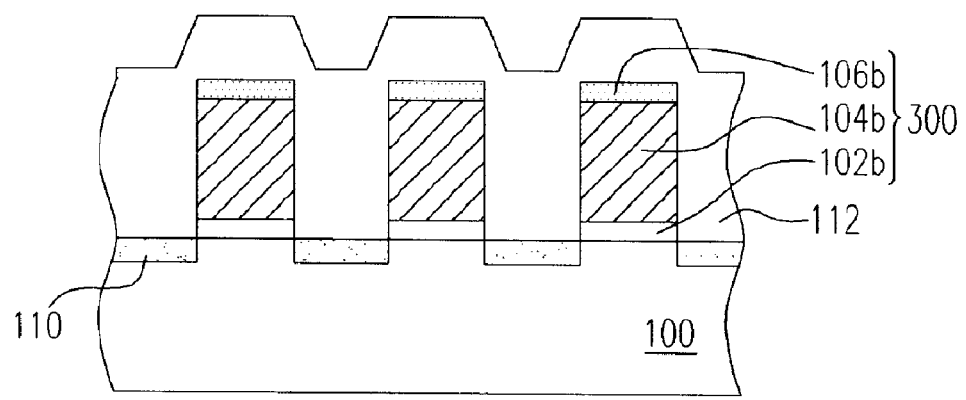

Referring to FIGS. 1D and 2D, an insulation layer 112 is formed on the substrate 100 to cover the gate structures 300 and fill the spaces between the gate structures 300. The material for forming the insulation layer 112 has an etching selectivity different from that of the mask layer 106b, and is, for example, silicon oxide, silicon nitride or spin-on-glass material. The method for forming the insulation layer 112 includes, for example, performing a high-density plasma chemical vapor deposition (HDP-CVD) or spin-coating.

Figure 1E:
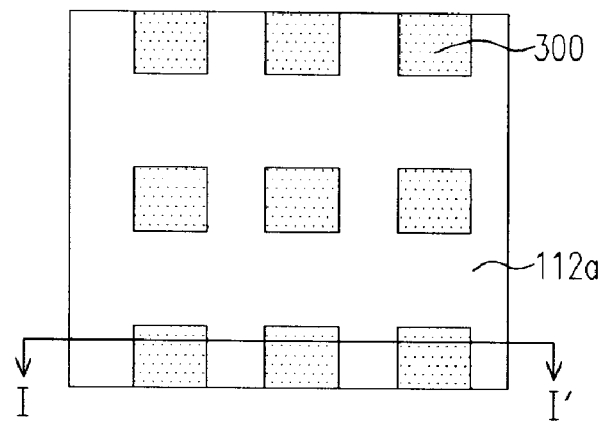
Figure 2E:
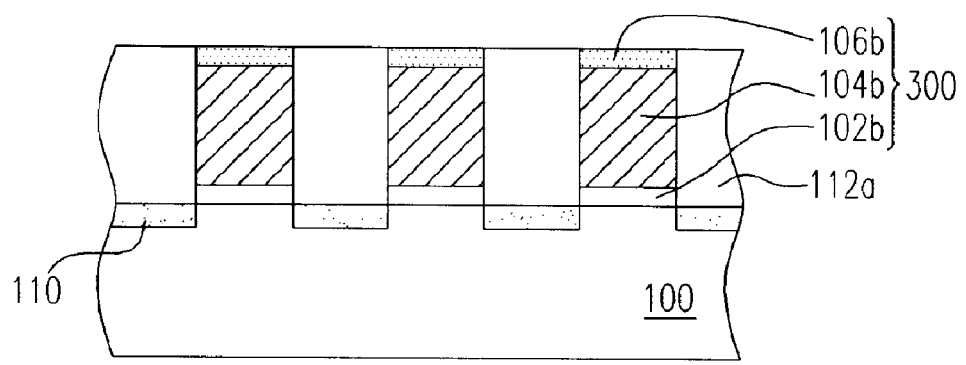

Referring to FIGS. 1E and 2E, the insulation layer 112 on the mask layer 106b is removed to expose the patterned mask layer 106b. The remaining insulation layer, located sideways adjacent to the gate structures 300, is denoted by reference numeral 112a. The method for partly removing the insulation layer 112 includes, for example, performing a chemical mechanical polishing (CMP) or a back etching.

Figure 1F:
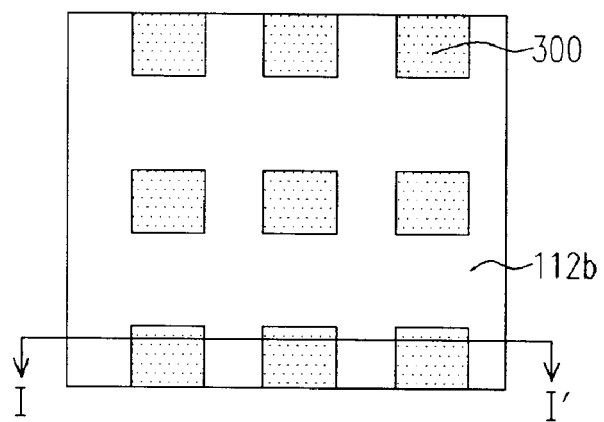
Figure 2F:
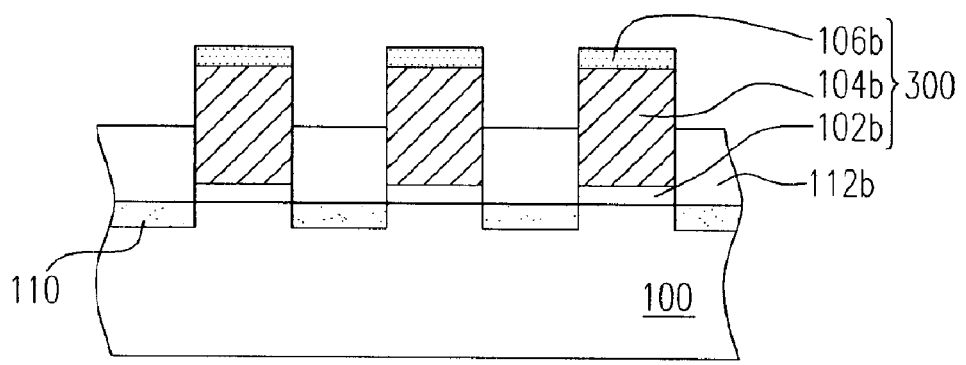

Referring to FIGS. 1F and 2F, a part of the remaining insulation layer 112a is removed to leave a remaining insulation layer 112b with a top surface lower than a top surface of the conductive layer 104b, such that a part of the sidewall of the conductive layer 104b is exposed. The method for partly removing the insulation layer 112a includes, for example, performing a back etching.

Figure 1G:
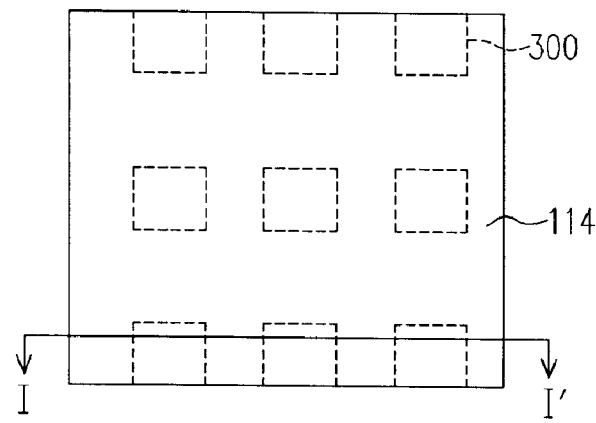
Figure 2G:
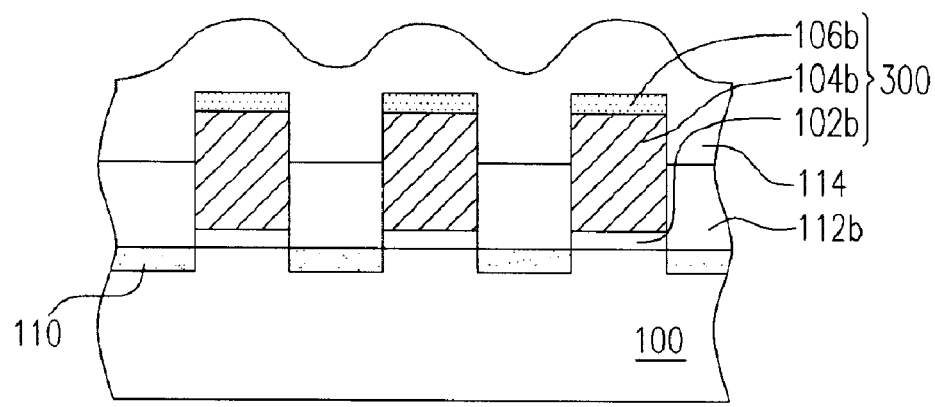

Referring to FIGS. 1G and 2G, a material layer 114 is formed on the insulation layer 112b to cover the gate structures 300 and fill the spaces between the gate structures 300. The material of the layer 114 includes, for example, boron-phosphorus silicate glass (BPSG) or phosphorus silicate glass (PSG), and has an etching rate different from those of the mask layer 106b and insulation layer 112b. A material layer 114 made of BPSG is formed by, for example, performing a normal-pressure CVD with silane, hydrogen phosphide, and hydrogen boride as reacting gas sources, and a reaction temperature between about 350° C. and 450° C.

Figure 1H:
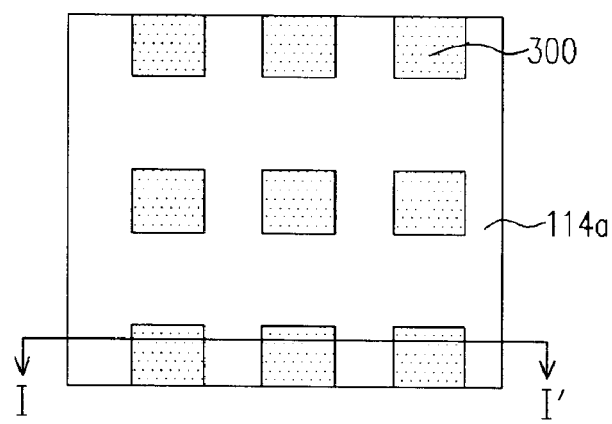
Figure 2H:
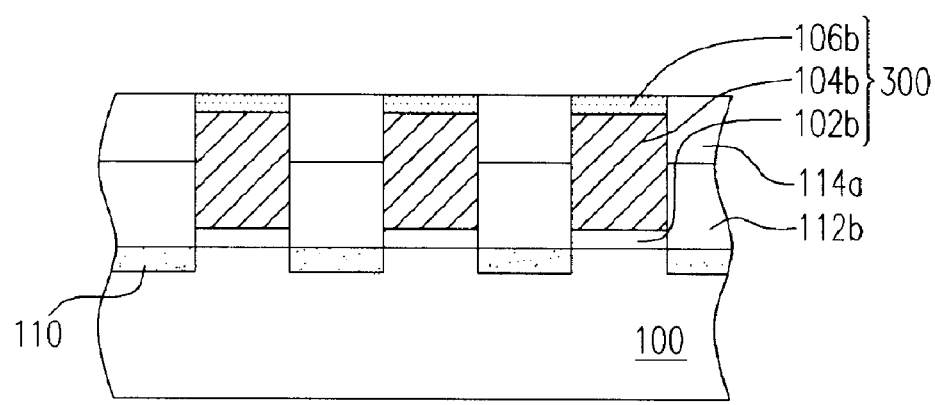

Referring to FIGS. 1H and 2H, the material layer 114 on the mask layer 106b is removed to expose the patterned mask layer 106b, which leaves remaining material layer 114a sideways adjacent to the gate structures 300. The method for removing the material layer 114 includes, for example, performing a CMP or back etching.

Figure 1I:
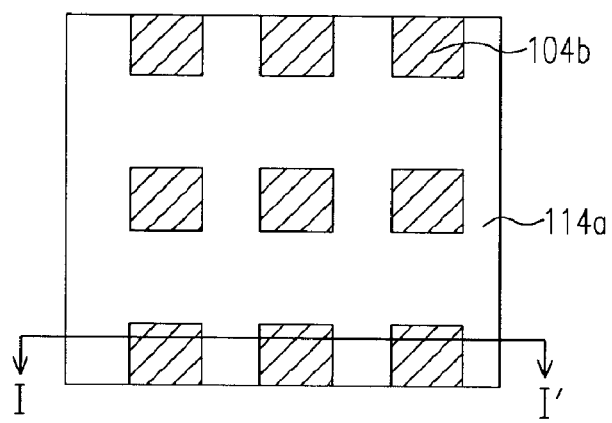
Figure 2I:
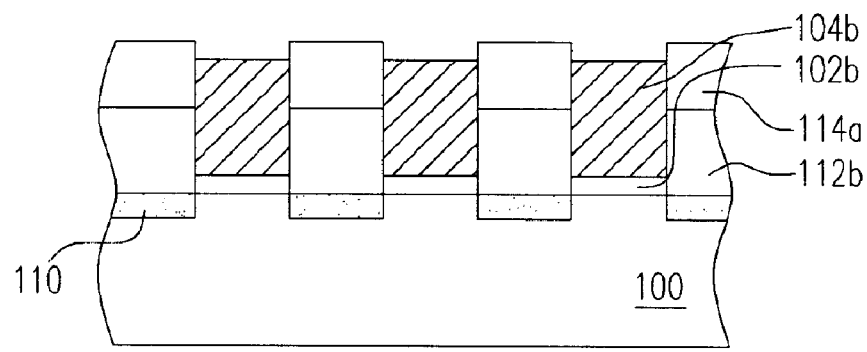

Referring to FIGS. 1I and 2I, the mask layer 106b is removed to expose the top surface of the conductive layer 104b. The method for removing the mask layer 106b includes, for example, performing a wet etching. If the material of the mask layer 106b is silicon nitride, the etchant used in the wet etching step includes, for example, phosphoric acid.

Figure 1J:
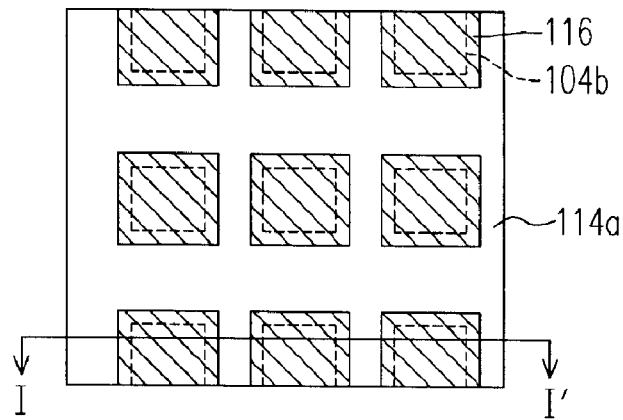
Figure 2J:
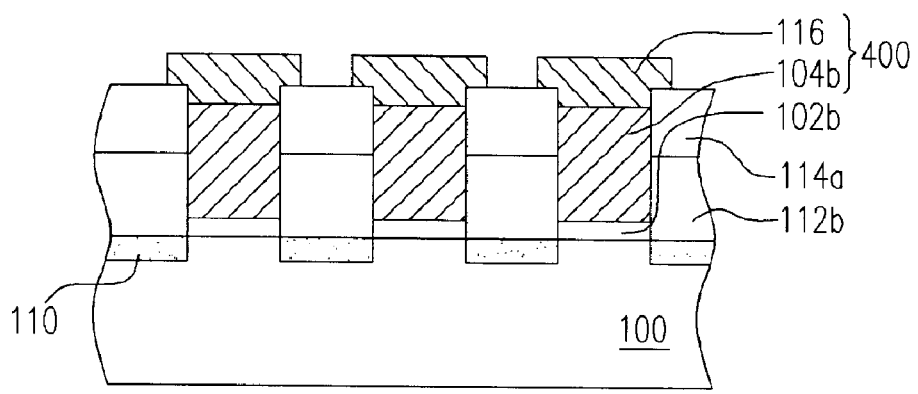

Referring FIGS. 1J and 2J, another patterned conductive layer 116 is formed on the patterned conductive layer 104b, and further overlaps a peripheral portion of the material layer 114a. In other words, the patterned conductive layer 116 has an upper surface area greater than that of the patterned conductive layer 104b, and forms with this latter a floating gate 400.

In an embodiment, the formation of the patterned conductive layer 116 comprises forming a conductive layer, for example, doped polysilicon, over the patterned conductive layer 104b and material layer 114a. Low-pressure CVD, for example, may be performed to form this conductive layer, on which a patterned photoresist layer (not shown) is subsequently formed. Using the patterned photoresist layer as a mask, the conductive layer 116 then is etched to expose the material layer 114a.

Figure 1K:
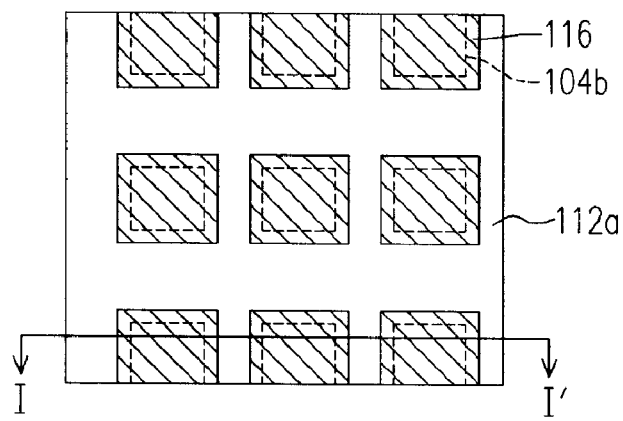
Figure 2K:
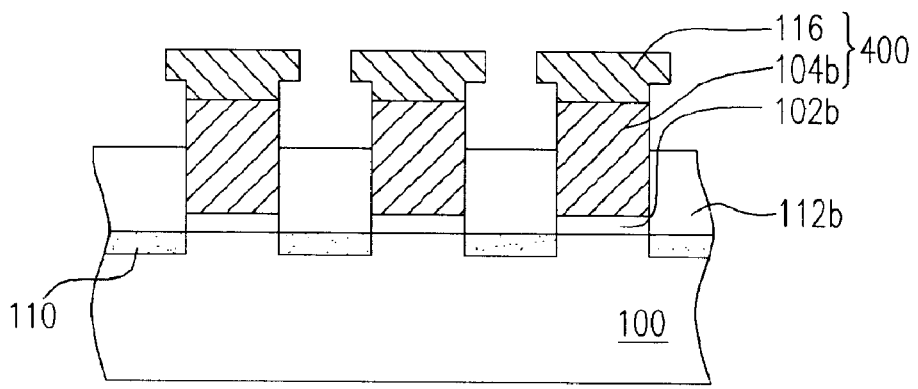

Referring to FIGS. 1K and 2K, the material layer 114a is removed by, for example, back etching.

Figure 1L:
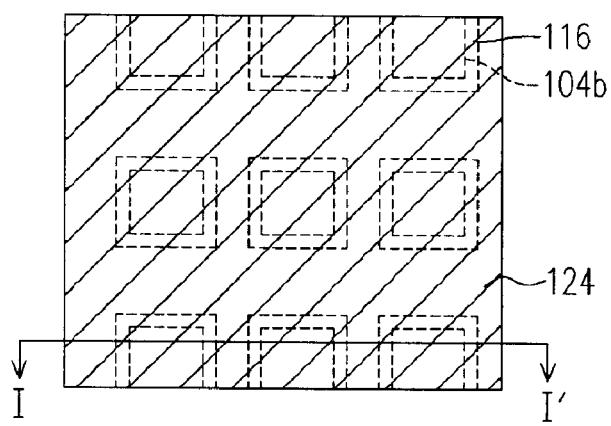
Figure 2L:
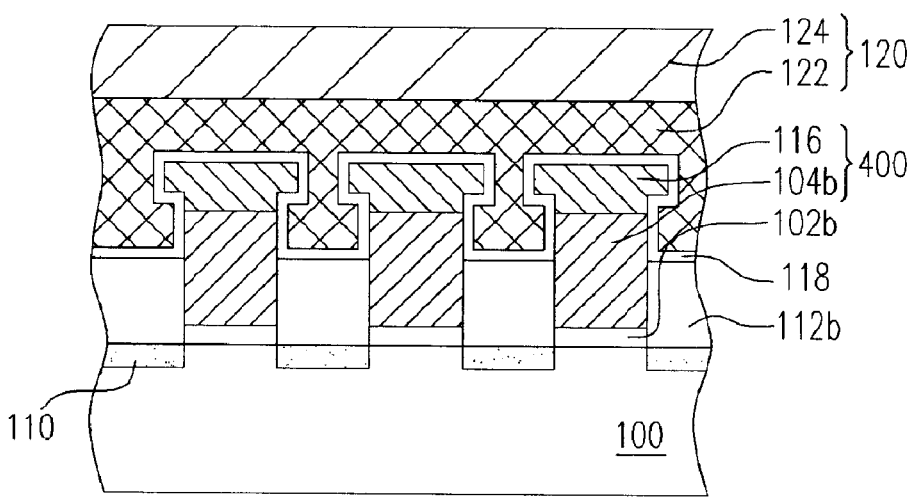

Referring to FIGS. 1L and 2L, a gate dielectric layer 118 is formed over the substrate to cover the sidewalls of the patterned conductive layer 104b and the top surface and sidewalls of the patterned conductive layer 116. The gate dielectric layer 118 is, for example, silicon oxide/silicon nitride/silicon oxide (ONO). The method for forming the gate dielectric layer 118 includes, for example, forming an oxide layer by thermal oxidation, followed by a low-pressure CVD to respectively form a silicon nitride layer and another silicon oxide layer. The gate dielectric layer 118 also may be made of other materials such as silicon oxide or silicon oxide/silicon nitride.

A conductive layer 120 is formed on the gate dielectric layer 118, used as a control gate. The conductive layer 120 includes, for example, a policide layer consisting of a doped polysilicon layer 122 and a metal silicide layer 124. The method for forming the doped polysilicon layer 122 includes, for example, performing an in-situ doping step. The metal silicide layer is formed by a method that comprises, for example, performing a low-pressure CVD using metal fluoride and silane as gas sources. The subsequent process for forming the flash memory is known in the art and is not further described.

As described above, the floating gate is comprised of two patterned conductive layers specifically formed by the invention. A first conductive layer is formed between the buried source/drain regions with sidewalls laterally exposed. A second conductive layer is formed on the first conductive layer in a manner to further extend over the adjacent buried source/drain regions. The overlapping area between the floating gate and the control gate thereby is increased, which favorably increases the device coupling ratio.

Figure 3:
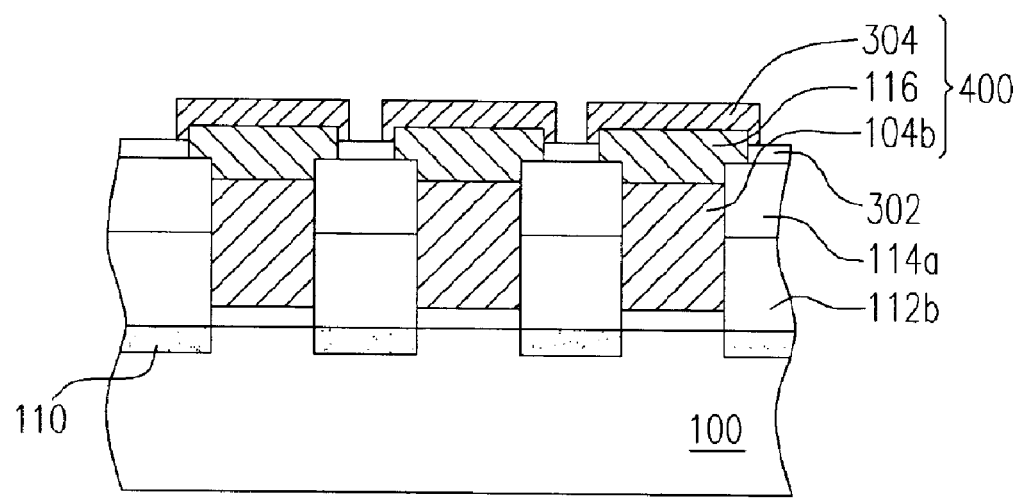
FIGS. 3 and 4 are cross-sectional views showing the fabrication process of a flash memory according to another embodiment of the present invention.

FIG. 3 illustrates an intermediary manufacture stage where the processed substrate has undergone the processing steps described in FIGS. 2A through 2J. Thereafter, a material layer 302 is formed in the spaces between the patterned conductive layer 116. The height of the top surface of the layer 302 is lower or approximately as high as that of the top surface of the patterned conductive layer 116. Another patterned conductive layer 304 is formed on the patterned conductive layer 116. The patterned conductive layer 304 covers the patterned conductive layer 116 and further extends over a peripheral portion of the material layer 302.

Figure 4:
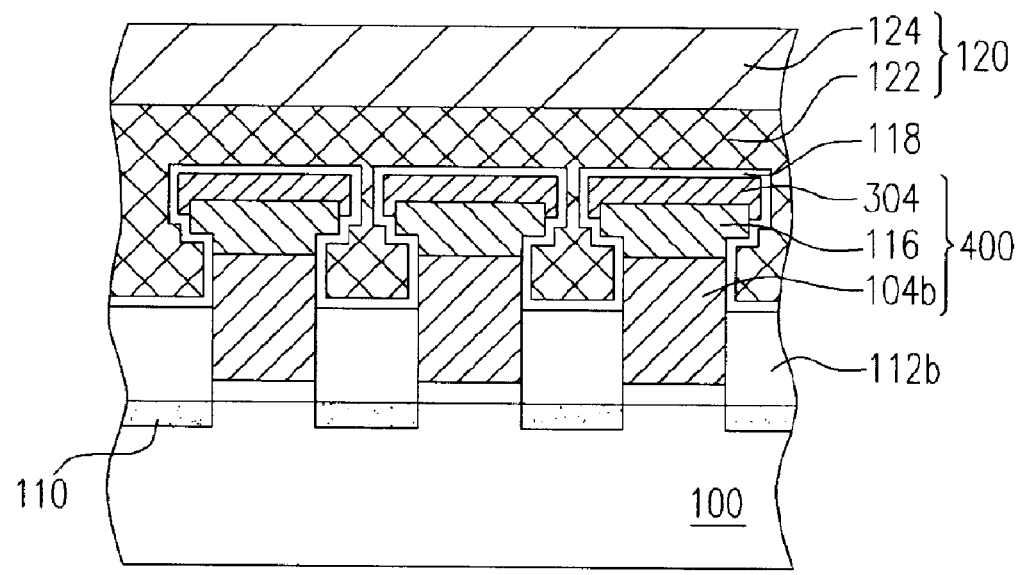

Referring to FIG. 4, the material layer 114a and the material layer 302 are removed to form a floating gate comprised of the conductive layers 104b, 116, 304. A gate dielectric layer 118 is subsequently formed on the exposed surface of the floating gate. Lastly, a conductive layer 120 is formed on the gate dielectric layer 118, used as control gate.

To further increase the overlapping area between the floating gate and the control gate, additional conductive layers may be further sequentially formed on the conductive layer 104b by repeating the above processing steps for forming the material layer 302 and conductive layer 304.

As described above, the height of the insulation layer surrounding the floating gate therefore is reduced in the invention, such that the sidewall of the floating gate is partly exposed, resulting in a larger overlapping area with the control gate. Consequently, the gate-coupling ratio is increased without increasing the cell area of the flash memory.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a flash memory, comprising:
   sequentially forming a tunneling dielectric layer, a first conductive layer and a mask layer on a substrate;
   patterning the tunneling dielectric layer, the first conductive layer and the mask layer to form at least a strip structure;
   performing an ion implantation to form a buried drain region in the substrate at one side of the strip structure;
   patterning the strip structure to form a gate structure, wherein the gate structure includes the tunneling dielectric layer, the mask layer, and the first conductive layer;
   forming an insulation layer adjacent to a sidewall of the gate structure, the insulation layer having a top surface lower than a top surface of the first conductive layer in a manner to expose a part of a sidewall of the first conductive layer;
   forming a material layer on the insulation layer sideways adjacent to the gate structure;
   removing the mask layer;
   forming a second conductive layer on the top surface of the first conductive layer of the gate structure, wherein the second conductive layer covers the top surface of the first conductive layer and further extends over the adjacent material layer and the first conductive layer and the second conductive layer together form a floating gate;
   removing the material layer to expose a part of the sidewall of the first conductive layer of the gate structure;
   forming a gate dielectric layer over the floating gate; and
   forming a control gate on the gate dielectric layer.

2. The method according to claim 1, further comprising the following steps performed after forming the second conductive layer and before removing the material layer:
   (a) forming an additional material layer sideways adjacent to the floating gate, wherein the top surface of the additional material layer is lower than or approximately as high as that of the floating gate;
   (b) forming an additional conductive layer on the second conductive layer of the gate structure, wherein the additional conductive layer covers the second conductive layer and further extends over the additional material layer, thereby the floating gate further includes the additional conductive layer; and
   (c) removing the additional material layer.

3. The method according to claim 2, wherein the material layer has an etching rate different from that of the insulation layer.

4. The method according to claim 2, further comprising repeating steps (a) through (c) after forming the additional conductive layer and before removing the additional material layer.

5. The method according to claim 1, wherein the material layer has an etching rate different from that of the insulation layer.

6. The method according to claim 5, wherein the material of the insulation layer is silicon oxide, silicon nitride, or spin-on glass.

7. The method according to claim 5, wherein the material layer includes either boron-phosphorus silicate glass or phosphorus silicate glass.

8. The method according to claim 1, wherein forming the insulation layer comprises:
   forming an insulation material over the substrate in a manner to cover the gate structure and fill a sideways adjacent space;
   selectively removing the insulation material on the top of the gate structure to expose the mask layer; and
   removing a part of the insulation material to form the insulation layer that has a top surface located at a height between a top surface and a bottom surface of the first conductive layer of the gate structure.

9. The method according to claim 8, wherein the step of selectively removing the insulation material on the top of the gate structure includes performing a chemical mechanical polishing (CMP) process or a back etching process.

10. The method according to claim 8, wherein the step of removing a part of the insulation material includes performing a back etching process.

11. A method of fabricating a flash memory, comprising:
    forming a patterned layer structure on a substrate, wherein the patterned layer structure comprises a tunneling dielectric layer and a first conductive layer formed over the substrate successively;
    forming an insulation layer adjacent to a sidewall of the first conductive layer, the insulation layer having a top surface located at a height between a top surface and a bottom surface of the first conductive layer;
    forming a material layer on the insulation layer sideways adjacent to the first conductive layer;
    forming a second conductive layer on the first conductive layer, wherein the second conductive layer covers the first conductive layer and further extends over the sideways adjacent material layer, the first and second conductive layers thereby form a floating gate;
    removing the material layer to expose a part of the sidewall of the floating gate;
    forming a gate dielectric layer covering at least the exposed part of the sidewall of the floating gate; and
    forming a control gate on the gate dielectric layer.

12. The method according to claim 11, further comprising the following steps performed after forming the second conductive layer and before removing the material layer:
    (a) forming an additional material layer sideways adjacent to the floating gate, wherein the top surface of the additional material layer is lower than or approximately as high as that of the floating gate;
    (b) forming an additional conductive layer on the second conductive layer of the gate structure, wherein the additional conductive layer covers the second conductive layer and further extends over the additional material layer, thereby the floating gate further includes the additional conductive layer; and
    (c) removing the additional material layer.

13. The method according to claim 12, wherein the material layer has an etching rate different from that of the insulation layer.

14. The method according to claim 12, wherein further comprising repeating steps (a) through (c) after forming the additional conductive layer and before removing the additional material layer.

15. The method according to claim 11, wherein the material layer has an etching rate different from that of the insulation layer.

16. The method according to claim 15, wherein the material of the insulation layer is silicon oxide, silicon nitride, or spin-on glass.

17. The method according to claim 15, wherein the material layer includes either boron-phosphorus silicate glass or phosphorus silicate glass.

18. The method according to claim 11, wherein forming the insulation layer comprises:

forming an insulation material over the substrate in a manner to cover the gate structure and fill a sideways adjacent space;

selectively removing the insulation material on the top of the gate structure to expose the top surface of the first conductive layer; and removing a part of the insulation material to form the insulation layer that has a top surface located at a height between the top surface and the bottom surface of the first conductive layer of the gate structure.

19. The method according to claim 18, wherein the step of selectively removing the insulation material on the top of the gate structure includes performing a chemical mechanical polishing (CMP) process or a back etching process.

20. The method according to claim 18, wherein the step of removing a part of the insulation material includes performing a back etching process.

* * * * *